United States Patent [19]
Lee et al.

[11] Patent Number: 5,548,555
[45] Date of Patent: Aug. 20, 1996

[54] METHOD AND CIRCUIT FOR REPAIRING DEFECT IN A SEMICONDUCTOR MEMORY DEVICE

[75] Inventors: Sung-Soo Lee; Jin-Ki Kim, both of Seoul, Rep. of Korea

[73] Assignee: Samsung Electronics Co., Ltd., Suwon-city, Rep. of Korea

[21] Appl. No.: 420,835

[22] Filed: Apr. 11, 1995

[30] Foreign Application Priority Data

Apr. 11, 1994 [KR] Rep. of Korea .................... 7549/1994

[51] Int. Cl.⁶ ............................................. G11C 7/00
[52] U.S. Cl. ................. 365/200; 365/225.7; 365/230.03
[58] Field of Search ............................. 365/200, 225.7, 365/230.03, 230.06

[56] References Cited

U.S. PATENT DOCUMENTS

| | | | |
|---|---|---|---|
| 4,473,895 | 9/1984 | Tatematsu | 365/200 |
| 5,297,085 | 3/1994 | Choi et al. | 365/200 |
| 5,379,259 | 1/1995 | Fujita | 365/200 |
| 5,392,246 | 2/1995 | Akiyama et al. | 365/200 |
| 5,422,850 | 6/1995 | Sukegawa et al. | 365/200 |

*Primary Examiner*—Joseph A. Popek
*Attorney, Agent, or Firm*—Cushman Darby & Cushman, L.L.P.

[57] ABSTRACT

A method and a circuit for repairing defect by substituting a redundant memory cell for a defective memory cell in the semiconductor memory device. The circuit comprises charging nodes connected parallel to a number of electrical fuses; a device for outputting a storage signal of a defective address in response to an external control signal; a device for providing current to the charging node in response to the storage signal of the defective address; a redundant sense amplifier for outputting a redundant block driving signal to substitute a defective address in response to a logic level of the charging node; and a controller for decoding an address signal provided from the outside of the memory device so that a current path is formed in a selected fuse and the fuse is blew by current provided from the charging node, the controller being activated by the storage signal of the defective address.

8 Claims, 7 Drawing Sheets

METHOD AND CIRCUIT FOR REPAIRING DEFECT IN A SEMICONDUCTOR MEMORY DEVICE

BACKGROUND OF THE INVENTION

The present invention relates to a semiconductor memory device, and more particularly to a method and a circuit for repairing a defect by substituting a redundant memory cell for a defective memory cell in the semiconductor memory device.

In general, as semiconductor elements become small and highly integrated, there arise difficulties in fabricating them, which reduce the yield rate of the semiconductor memory devices. Reduction of the yield rate caused by the defective memory cell functions as a significant problem in the manufacturing of semiconductor memory devices. Therefore, in order to overcome this problem redundant cell are widely used. Thus, the yield rate is improved by substituting a redundant memory cell fabricated as a spare memory cell for a defective memory cell to repair the defect. It is necessary, however, store the position, i.e., the address, of the defective memory cell when substituting the redundant memory cell for the defective memory cell. Generally, there are two methods of storing the address, one of which is a fuse blowing method and the other is to use an electrically erasable and programmable nonvolatile memory cell as the storage device of the defective address. With the fuse blowing method, the defective address is stored by performing a fuse blowing operation through the flow of current or irradiation of a laser beam toward the fuse elements to store the defective address.

The laser fuse blowing method can be used in only a wafer state previous to a package process, i.e., a fuse exposure state, but it can not be used after the package process is complete.

On the other hand, when nonvolatile memory cell is used as the defective address storing device, it is possible to store the address even in the packaged state. However, since the memory device itself is a memory cell, if the specific state, e.g., high temperature and high voltage state of this defective address information, is not kept, malfunctions may arise in the semiconductor memory device. Therefore, the reliability of memory devices which use the nonvolatile memory cell method is less than the fuse blowing method. Thus, an electrical fuse blowing method is widely used for storing the address of defective memory cells. Such an electrical fuse blowing method is disclosed at pages 128~129 of a paper in "IEEE INTERNATIONAL SOLID STATE CIRCUITS CONFERENCE DIGEST OF TECHNICAL PAPERS" published on 1989.

However, in the conventional electrical fuse blowing method, since a number of fuses are simultaneously blown to store the defective address, it is necessary to provide enough current to blow many fuses. Further, due to the need for more current an added pad or pressure pin is needed, which also causes problems, since such a voltage application pad additionally formed in the wafer state adversely influences the integration of the elements. Moreover, in order to provide sufficient current for fuse blowing in the package state, since the high voltage is applied to the internal of the memory device through the added input/output pin, there arises the other problem in that the spare pin is necessary.

SUMMARY OF THE INVENTION

It is therefore object of the present invention to provide a method and a circuit for repairing the detect of a semiconductor memory device which overcomes the problems that exist in the prior art.

It is another object of the present invention to provide a method and a circuit for repairing a defect in a semiconductor memory device after completion of packaging.

It is yet another object of the present invention to provide a method and a circuit for repairing a defect in a semiconductor memory device which performs a fuse blowing operation with only a power supply voltage and not an externally generated fuse blowing voltage.

In the present invention to achieve the above objects, it is possible to perform the fuse blowing operation with only the power supply voltage provided to the memory device by serially blowing the fuses without simultaneously blowing a number of fuses corresponding to the address signals of the defective memory cell. The present invention thus includes an internal fuse selector connected to the external address pins. Further, according to the present invention, the specific fuse is selected and blew by the fuse selector by varying the signals input to the external address pins. Thereby, the fuse selection operation and the fuse blowing operation are performed up to the maximum N times in case that the N fuses are blown to store the defective address.

Therefore, in accordance with the present invention, it is possible to repair all of the defect in the wafer and the package states and also possible to repair the defect without using an added pad or pressure pin for providing current for the fuse blowing operation because the size of the current needed to perform the fuse blowing operation can be lowered.

BRIEF DESCRIPTION OF THE DRAWINGS

The above and other objects, advantages and features of the present invention will be more apparent from the following detailed description taken with the attached drawings in which.

DETAILED DESCRIPTION OF THE PREFERRED EMBODIMENT

Figure 1:
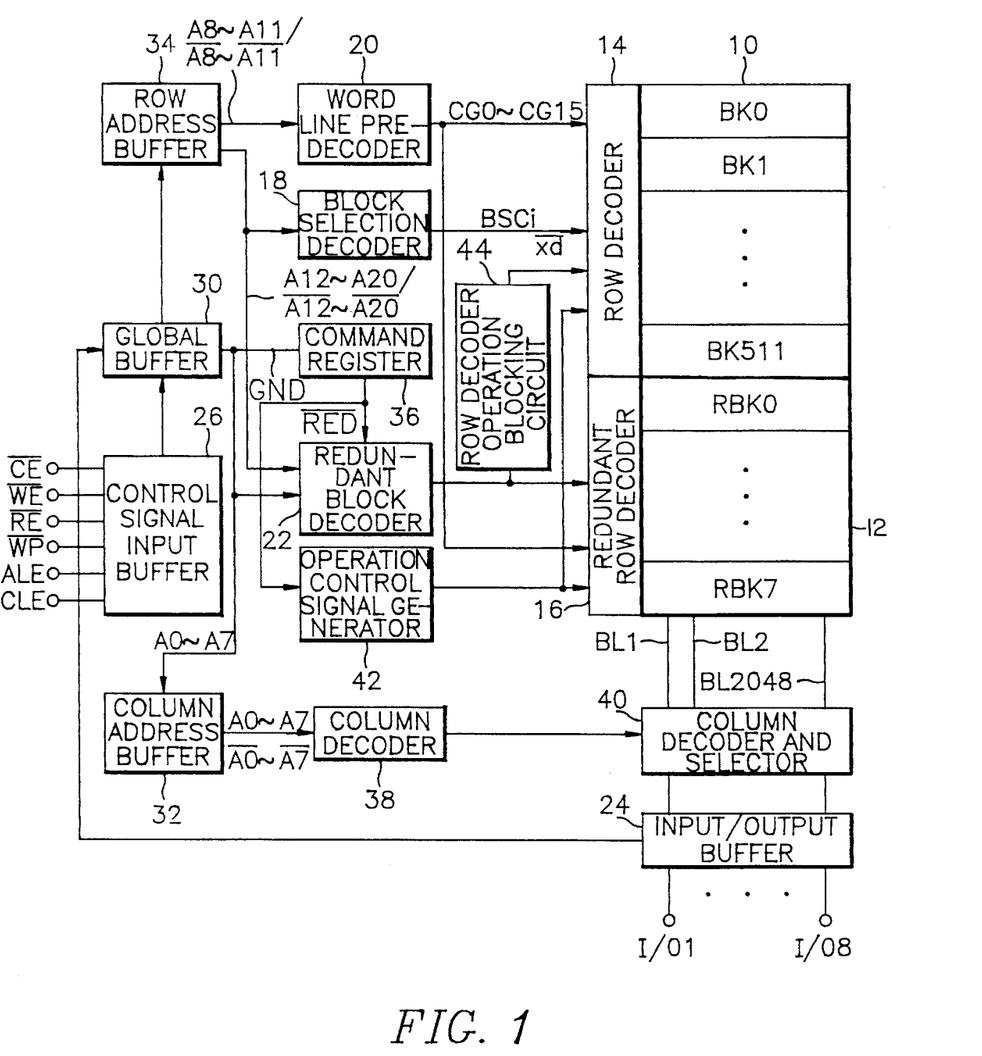
FIG. 1 is a schematic block diagram showing a nonvolatile semiconductor memory device employing a defect repairing circuit according to the present invention.

FIG. 1 is a schematic block diagram showing an electrically erasable and programmable nonvolatile semiconductor memory device employing a defect repairing circuit in accordance with the present invention.

As an electrically erasable and programmable nonvolatile memory device (EEPROM), the memory device of FIG. 1 has a memory cell array 10 and a redundant cell array 12 for repairing defect. The memory cell array 10 is divided into 512 row blocks BK0~BK511 and the redundant cell array 12 into 8 row blocks RBK0~RBK7. The respective row blocks are arranged in the same row and are composed of 2048 NAND cell strings which share word lines to each other. The NAND cell strings are connected to the corresponding bit lines BL1~BL2048 by ones. As a general electrically erasable and programmable nonvolatile memory cell, the memory cell has a 'control gate/layer insulation/floating gate/tunnel oxide film' structure on a substrate of the semiconductor. The control gates of the memory cells are each connected to the corresponding word lines. Therefore, the memory cell array 10 of FIG. 1 has 512×2048×16 (=16,777, 216) memory cells and the redundant cell array 12 has 8×2048×16 (=262,144) memory cells. Further, the memory cell array 10 and the redundant cell array 12 are divided into 8 column blocks corresponding to 8 data input/output pins I/O1~I/O8. Each of the column blocks has 256 bit lines BL1~BL256, BL257~BL512, . . . , BL1793~BL2048 arranged in the perpendicular direction to the word lines which are shared to each other. The column blocks lie under a parallel relationship so that one lit line is selected in the 8 column blocks by the column address. Therefore, the data input/output pin I/O0~1/O8 become a path through which 8 bit parallel data is input or output.

Figure 2:
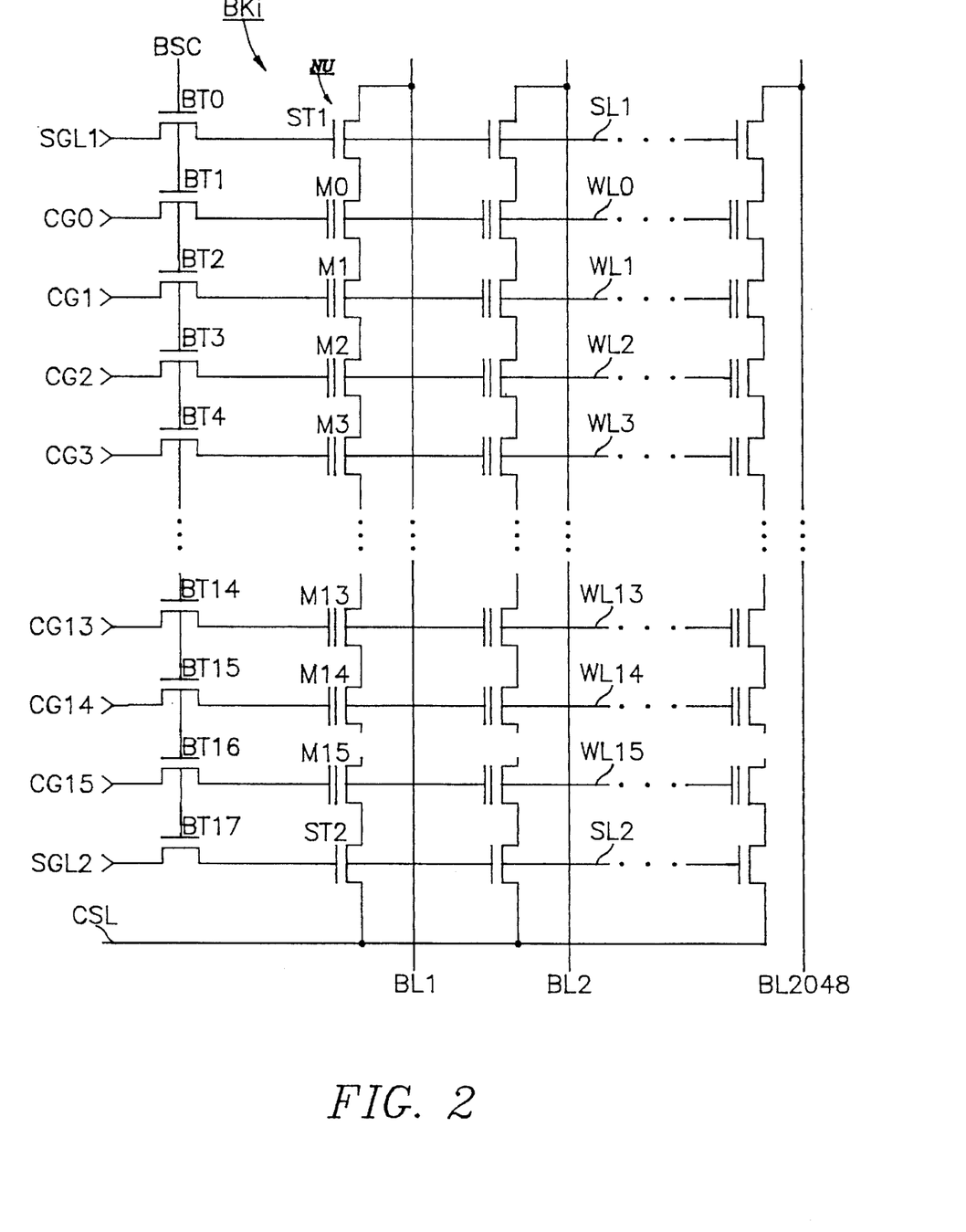
FIG. 2 is a detailed circuit diagram showing a row block shown in FIG. 1.

FIG. 2 shows a detailed circuit diagram of an i row block BKi. The row block BKi has 2048 NAND cell strings NU connected each to the bit lines BL1~BL2048. One NAND cell string consists of 16 memory cells M0~M15 whose drain-source paths are serially connected between a source terminal of a first selection transistor ST1 and a drain terminal of a second selection transistor ST2. The drain terminal of the first selection transistor ST1 of the NAND cell string is connected to the bit line and a gate terminal thereof is commonly connected to a first string selection line SL1 provided with a first string selection signal SGL1 through a transmission transistor BT0. Further, the source terminal of the second selection transistor ST2 is connected to a common source line CSL and the gate terminal thereof is commonly connected to the second string selections line SL2 inputting a second string selection signal SGL2 through the transmission transistor BT17. The word lines WL0~WL15 input control gate driving signals CG0~CG15 through the transmit transistors BT1~BT16, the word lines WL0~WL15 being connected correspondingly to the control gate terminals of the memory cells M0~M15 of the NAND cell strings. The gate terminals of the transmit transistors BT0~BT17 are commonly controlled by a block selection signal BSC.

Returning now to FIG. 1, the driving of the memory cell array 10 is controlled by the row decoder 14 and that of the redundant row decoder 16 is controlled by the redundant row decoder 16. The row decoder 14 activates any one of the row blocks BK0~BK511 according to the block selection signal BSCi input from the block selection decoder 18. Also, the row decoder 14 provides the control gate driving signals CG0~CG15 input from a word line predecoder 20 to the word lines WL0~WL15 of the selected row block. The redundant row decoder 16 activates any one of the row blocks RBK0~RBK7 of the redundant cell arrays 12 according to the redundant block selection signals RR0~RR7 applied from the redundant block selection decoder 22. Also, the redundant row decoder 16 provides the control gate driving signals CG0~CG15 input from a word line predecoder 20 to the word lines WL0~WL15 of the selected row block.

The EEPROM shown in FIG. 1 inputs/outputs various kinds of data and inputs the address signals through an input/output buffer 24. A control signal input buffer 26 input control signals $\overline{CE}$, $\overline{WE}$, $\overline{WP}$, $\overline{RE}$, ALE, and CLE. In case that the address latch enable signal ALE is enabled to the "high" level, the input buffer 24 operates as a device for inputting the address. At this time, 8 bit address signal is simultaneously input to a global buffer 30 through the input/output pins I/O1~I/O8. The global buffer 30 is controlled by the address latch enable signal to thereby input the address signals and divide the input signal. The address signals A0~A7 are transferred to a column address buffer 32 and the other address signals A8~A20 are transferred to the row address buffer 34. Further, in cast that the command latch enable signal CLE is enabled to the "high" level, the input/output buffer 24 operates as a device for inputting command word. At this time, the command word is input to the global buffer 30 through the input/output pins I/O1~I/O8. The global buffer 30 is controlled by the command latch enable signal to thereby input and transfer the command signal to a command register 36. The command register 36 temporarily stores and outputs the input command words.

The column address buffer 32 shapes the input column address signals A0~A7 to thereby transfer the signals A0~A7 and their reverse signals $\overline{A0}$~$\overline{A7}$ to the column decoder 38. The column decoder 38 decodes the input signals and controls the column decoder and a selector 40, so that the column decoder 38 enables the selected bit lines to give and receive data to each other through the data input/output buffer 24 and the input/output pins I/O1~I/O8. The row address buffer 34 shapes the input row address signals A8~A20 to thereby transfer the signals A12~A11 and their reverse signals $\overline{A8}$~$\overline{A11}$ to the word line predecoder 20 and transfer the signals A12~A20 and their reverse signals $\overline{A12}$ and $\overline{A20}$ to the word line predecoder 18.

The block selection decoder 18 decodes the input signals to thereby output the block selection signal BSCi for activating any one of the selected row blocks of the row blocks BK0~BK511. The word line predecoder 20 decodes the input signals to thereby output the control gate driving signals CG0~CG15.

The command words related with read, erasure, and program among the command words output in the command register 36, is input to an operational control signal generator 42. The redundant program control signal $\overline{RED}$ is input to the block decoder 22, the signal $\overline{RED}$ controlling an operation to write the address of the row block including the defective cell.

The redundant block decoder 22 is a device by which the address of the row block including the defective cell is written. Further, the redundant block decoder 22 inputs the address signals A0~A6 and $\overline{A12}$~$\overline{A20}$ when the control signal $\overline{RED}$ is applied at the "low" level. Thereby, the redundant block decoder 22 stores the address of the row block including the defective cell through the blowing operation of the fuse elements designated according to the address signals A0~A6 and $\overline{A12}$~$\overline{A20}$. Further, after the end of the defect repairing operation, the redundant block decoder 22 checks whether the block selection signal designated by the row addresses A12~A20/$\overline{A12}$~$\overline{A20}$ is the same as the defect block address written in the row addresses A12~A20/$\overline{A12}$~$\overline{A20}$. In accordance with the result of the check, the redundant block decoder 22 determines whether or not the redundant block decoder 16 can be driven. The row decoder operation blocking circuit 44 outputs the control signal $\overline{Xd}$ to inactivate the row decoder 14 when any one of the redundant block selection signals RR0~RR7 output in the redundant block decoder 22 is enabled.

Figure 3:
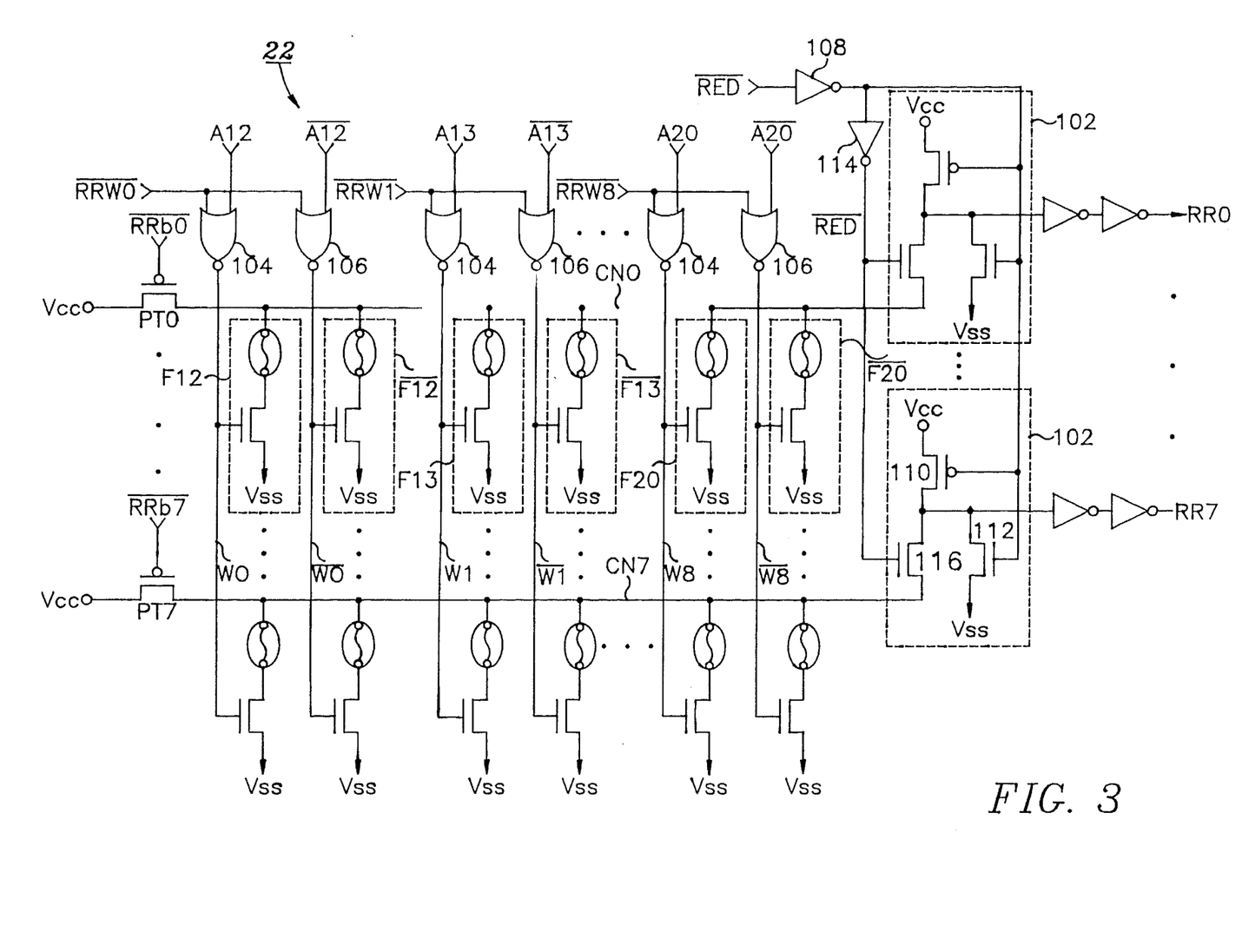
FIG. 3 is a detailed circuit diagram showing a redundant block decoder according to the present invention.

FIG. 3 is a detailed circuit diagram showing the redundant block decoder 22 according to the present invention. For convenience of the explanation, the signal lines CN0~CN7 arranged in the direction of row are called a "data line", whereas the signal lines W0/$\overline{W0}$~W8/$\overline{W8}$ arranged in the direction of column are called a "fuse selection line".

Nine fuse elements F12~F20 and the nine fuse elements $\overline{F12}$~$\overline{F20}$ are parallel connected to each of the data lines CN0~CN7, the nine fuse elements F12~F20 being controlled by the corresponding fuse selections W0~W8 arranged in the direction of the column and the nine fuse elements $\overline{F12}$~$\overline{F20}$ being controlled by the corresponding fuse selections $\overline{W0}$~$\overline{W8}$. Each of the fuse elements is comprised of an electrical fuse (e.g., a poly silicon road) whose one terminal is connected to the corresponding data line and an N-channel transistor whose channel is coupled between the other terminal of the fuse and the ground voltage VSS and whose gate terminal is coupled to the corresponding fuse selection line.

One terminal of the data lines CN0~CN7 is provided with the power voltage VCC through the channels of the corresponding P-channel transistors PT1~PT7 and the other terminals thereof are connected to the redundant sense amplifiers 102. The gate terminals of the P-channel transistors PT1~PT7 are controlled by the corresponding data line selection signals $\overline{RRb0}$~$\overline{RRb7}$.

The fuse selection lines W0~W8 are each coupled to the corresponding output nodes of eight NOR gates 104 which subsequently output the NOR of the eight fuse selection signal $\overline{RRW0}$~$\overline{RRW8}$ and the block selection address signals A12~A20. The fuse selection lines $\overline{W0}$~$\overline{W8}$ are each coupled to the corresponding output nodes of eight NOR gates 106 which subsequently output the NOR of the eight fuse selection signal $\overline{RRW0}$~$\overline{RRW8}$ and the block selection address signals $\overline{A12}$~$\overline{A20}$.

The redundant sense amplifier 102 connected to each data line includes a P-channel transistor 110 for pull-up, an N-channel transistor 112 for pull-down, and an N-channel transistor 116 for pull-down. The P-channel transistor 110 has a channel connected between an output node to output the redundant block selection signal RRi(i=0~7) and the power voltage and a gate terminal to input the reverse signal RED of the control signal $\overline{RED}$ through an inverter 108. The N-channel transistor 112 has the channel connected between the output node and the ground voltage and the gate terminal to input the reverse signal RED of the control signal $\overline{RED}$ through the inverter 108. The N-channel transistor 116 has the channel connected between the output node and the data lines CNi (i=0~7) and the gate terminal to input the control signal $\overline{RED}$ through an inverter 114 connected to an output node of the inverter 108.

Figure 4:
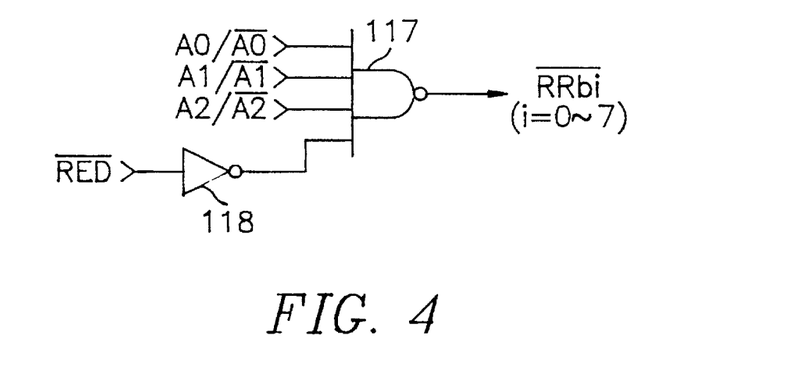
FIG. 4 is a circuit diagram showing the generation of data line select signals $\overline{RRb0}$~$\overline{RRb7}$ of FIG. 3.

FIG. 4 shows a generator for generating the data line selection signals $\overline{RRb0}$~$\overline{RRb7}$ provided to the circuit of FIG. 3. Referring to FIG. 4, the 4-input-NAND gate 117 inputs the address signals A0/$\overline{A0}$~A2/$\overline{A2}$ and the inverse signal RED of the redundant program control signal $\overline{RED}$ and then outputs the result of the NAND as the data line selection signals $\overline{RRbi}$ (i=0~7), the address signals A0/$\overline{A0}$~A2/$\overline{A2}$ being input from the global buffer 30 and the redundant program control signal $\overline{RED}$ being input from the inverter 118. Actually, the eight circuits are arranged in the memory device and each of the circuits, as shown in <Table 1>, inputs the eight-3bit-signals obtained by decoding the address signals A0, A1, and A2, i.e., one of signals $\overline{A0}$ $\overline{A1}$ $\overline{A2}$, A0 $\overline{A1}$ $\overline{A2}$, . . . , A0 A1 A2, and also commonly inputs the signal $\overline{RED}$. Further, the circuits output any one of the signals $\overline{RRb0}$, $\overline{RRb1}$, . . . , $\overline{RRb7}$. Therefore, it is possible to output any one of the data line selection signals $\overline{RRbi}$ (i=0~7) by changing the logic level of the input address signals A0/$\overline{A0}$~A2/$\overline{A2}$. In case that the redundant program control signal $\overline{RED}$ is disabled to the "high" level (i.e., in case that the redundant program node is not), all of the data line selection signals $\overline{RRbi}$ (i=0~7) are output at the "high" level, whereas in case that the signal $\overline{RED}$ is enabled to the "low" level(i.e., in case of the redundant program mode), the data line selection signal is enabled to the "low" level according to the change of the logic level of the address signals as shown in <Table 1>.

TABLE 1

| Address Signal | | | Data Line Selection Signal |
|---|---|---|---|
| A2 | A1 | A0 | Output at the Low Level |
| 0 | 0 | 0 | $\overline{RRb0}$ |
| 0 | 0 | 1 | $\overline{RRb1}$ |
| 0 | 1 | 0 | $\overline{RRb2}$ |
| 0 | 1 | 1 | $\overline{RRb3}$ |
| 1 | 0 | 0 | $\overline{RRb4}$ |
| 1 | 0 | 1 | $\overline{RRb5}$ |
| 1 | 1 | 0 | $\overline{RRb6}$ |
| 1 | 1 | 1 | $\overline{RRb7}$ |

Figure 5:
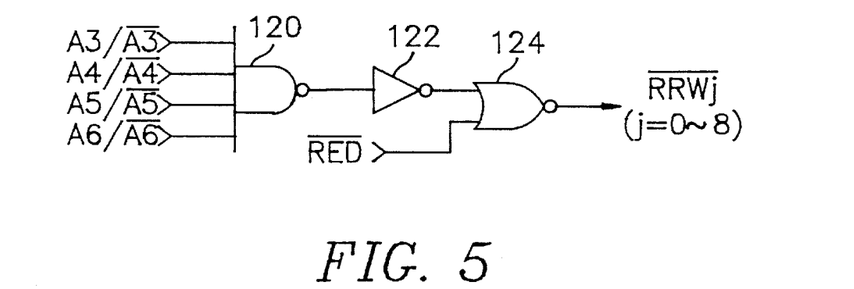
FIG. 5 is a logic circuit diagram showing the output of fuse selection signals $\overline{RRW0}$~$\overline{RRW8}$ of FIG. 3.

FIG. 5 shows a circuit generating the fuse selections signals $\overline{RRW0}$~$\overline{RRW8}$. Referring to FIG. 5, the 4-input-NAND gate 120 inputs the address signals A3/$\overline{A3}$~A6/$\overline{A6}$ provided from the global buffer 30 and transfers the result of the NAND to the inverter 122. The NOR gate 124 NORs an output of the inverter 122 with the redundant program control signal $\overline{RED}$ and then outputs the result of the NOR as the fuse selection signals $\overline{RRWj}$ (j=0~8). Actually, the nine circuits are arranged in the memory device and each of the circuits, as shown in <Table 2>, inputs the nine-4bit-signals obtained by decoding the address signals A3, A4, A5, and A6, i.e., one of signals $\overline{A6}$ $\overline{A5}$ $\overline{A4}$ $\overline{A3}$, $\overline{A6}$ $\overline{A5}$ $\overline{A4}$ A3, $\overline{A6}$ $\overline{A5}$ A4 $\overline{A3}$, . . . , A6 A5 A4 A3, and also commonly inputs the signal $\overline{RED}$. Further, the circuits output any one of the signals $\overline{RRW0}$, $\overline{RRW1}$, . . . , $\overline{RRW8}$. Therefore, it is possible to output any one of the fuse selection signals $\overline{RRWj}$ (j=0~8) by changing the logic level of the input address signals A3/$\overline{A3}$~A6/$\overline{A6}$. In case that the redundant program control signal $\overline{RED}$ is disabled to the "high" level (i.e., in case that the redundant program node is not), all of the fuse selection signals $\overline{RRWj}$ (j=0~8) are output at the "low" level, whereas in case that the signal $\overline{RED}$ is enabled to the "low" level (i.e., in case of the redundant program mode), only the specific decoding signal is output at the "low" level according to the change of the logic level of the address signals as shown in <Table 2>.

TABLE 2

| Address Signal | | | | Fuse Selection Signal |
|---|---|---|---|---|
| A6 | A5 | A4 | A3 | Output at the Low Level |
| 0 | 0 | 0 | 0 | $\overline{RRW0}$ |
| 0 | 0 | 0 | 1 | $\overline{RRW1}$ |
| 0 | 0 | 1 | 0 | $\overline{RRW2}$ |
| 0 | 0 | 1 | 1 | $\overline{RRW3}$ |
| 0 | 1 | 0 | 0 | $\overline{RRW4}$ |

TABLE 2-continued

| Address Signal | | | | Fuse Selection Signal |
|---|---|---|---|---|
| A6 | A5 | A4 | A3 | Output at the Low Level |
| 0 | 1 | 0 | 1 | $\overline{RRW5}$ |
| 0 | 1 | 1 | 0 | $\overline{RRW6}$ |
| 0 | 1 | 1 | 1 | $\overline{RRW7}$ |
| 1 | 0 | 0 | 0 | $\overline{RRW8}$ |

Figure 6:
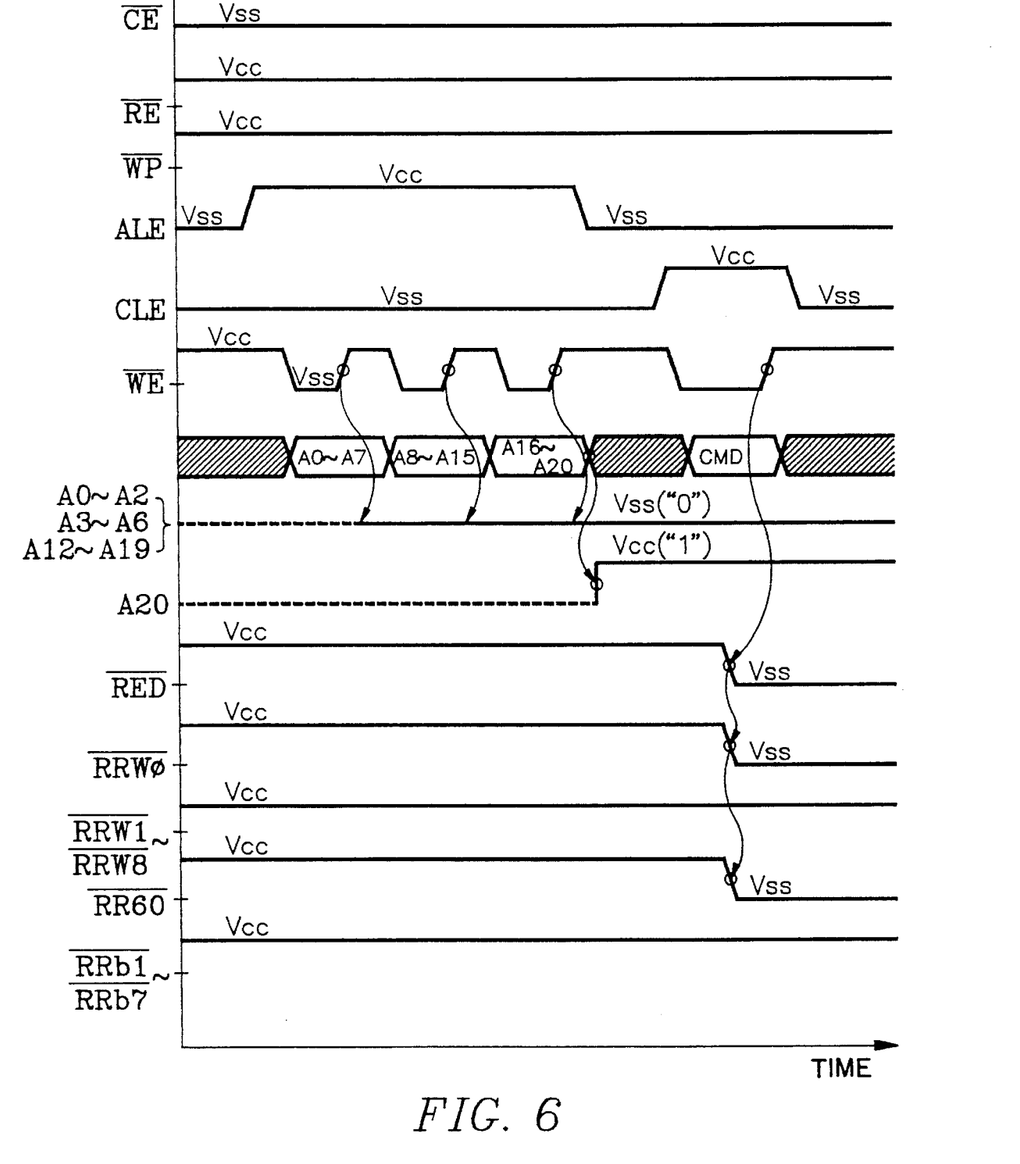
FIG. 6 is an operational timing diagram of FIG. 1 according to the redundant program operation.

FIG. 6 is an operational timing diagram according to the redundant program operation of FIG. 1. With respect to FIGS. 4 to 6, the defective address is written in the redundant block decoder 22 of FIG. 3 as follows. In accordance with the present invention, the fuse blowing operation is serially performed, not simultaneously, in the redundant block decoder 22 shown in FIG. 3 so as to write the address of the defective row block.

For convenience of the explanation, an example of one case where there is one defective row block and one redundant row block required for repairing the defect will be provided. In this case, the logic level of the block selection address A12 to designate the defective row block of the row blocks of the memory address is "1" and those of the other block selection addresses A13~A20 are "0", the defective row block is thus substituted for the first redundant row block RBK0 corresponding to the redundant block selection signal RR0.

In order to begin the redundant program operation, input of the address signal for selecting the write clement of the redundant block decoder must be just performed. The input process of the address signal is as follows. First, the address latch enable signal ALE is applied at the "high" level and the input/output buffer 24 is convened into the address input mode. Next, the address signals A0~A7, A8~A15, and A16~A20 are input to the data input/output pins I/O1~I/O8 and the write enable signal $\overline{WE}$ is changed to the "low" level from the "high" level. Then, the change operation is performed during three times, thereby inputting the address signals A0~A20 to the global buffer 30.

The signals A0~A2 of the address signals are used for making the data line selection signals. Further, since a line CN0 of the data lines is intended to blow the fuse in the redundant block decoder 22, as shown in <Table 1>, the address signals "A0 A1 A2" are input as "000".

In accordance with the present invention, the address signals "A3 A4 A5 A6" for making the fuse selection signals, as shown in <Table 2>, are input as "0000" so that the fuse selection signal $\overline{RRW0}$ is enabled to the "low" level. The address signals A7~A11 is not used in the defective address program mode.

The address signals A12~A20 for designating the address of the row block input the logic level of the signal A12 as "1" and also input those of the other signals A20~A13 as "0" according to the address of the defective row block of the row blocks.

After the complete of the address input, an input process of the redundant program command word is begun. The input process is as follows. First, the command latch enable signal CLE is applied at the "high" level and the input/output buffer 24 is converted into the command input mode. After the command word CMD is input through the data input/output pins I/O1~I/O8, the write enable signal $\overline{WE}$ is changed to the "low" level from the "high" level, so that the command word is input to the global buffer 30. The input command word is stored in the command register 36 and contrary the redundant program signal $\overline{RED}$ enabled to the "low" level is output to the command register 36.

The redundant program control signal $\overline{RED}$ is output at the "low" level and then the fuse blowing process, i.e., the write process of the defective address is begun. Referring to FIG. 4, when the redundant program signal $\overline{RED}$ is enabled to the "low" level, the data line selection signal $\overline{RRb0}$ is enabled to the "low" level. Referring again to FIG. 3, the P-channel transistor PT0 is turned on and the data line CN0 is thereby charged to the power supply voltage VCC level. At this time, since the signals $\overline{RRb1}$~$\overline{RRb7}$ are disabled to the "high" level, the data lines CN1~CN7 are in a floating state. Further, referring to FIG. 5, when the redundant program signal $\overline{RED}$ is enabled to the "low" level, the fuse selection signal $\overline{RRW0}$ is enabled to the "low" level. At this time, since the signals $\overline{RRW1}$~$\overline{RRW8}$ are disabled to the "high" level, all of the corresponding fuse selections W1/$\overline{W1}$~W8/$\overline{W8}$ are maintained at the "low" level.

Therefore, the NOR gate 104 outputs the NOR of the signal $\overline{RRW0}$ enabled to the "low" level and the address signal A12 input as the logic level "1" at the "low" level. Further, the NOR gate 106 outputs the NOR of the signal $\overline{RRW0}$ and the address signal $\overline{A12}$ input as the logic level "1" at the "high" level. Thereby, the N-channel transistor of the write clement $\overline{F12}$ is turned on, of which gate terminal is connected to the fuse selection line $\overline{W0}$, thereby allowing current to flow into the ground terminal from the data line CN0 through the fuse and the channel of the N-channel transistor. The current flowing into the fuse is sufficient to blow the fuse, since the voltage provided to the data line CN0 is applied to one selected fuse. At this time, if the power supply voltage applied from the exterior of the memory device is higher than the normal power supply voltage (for example, if the normal power supply voltage is 5 volt, the power supply voltage of 9 volts is provided in the fuse program), it is very effective in the fuse blowing operation of the write element $\overline{F12}$. In accordance with the fuse blowing operation, the process of writing the least bit A12 of the block selection address signals of the defective row blocks is achieved.

The process of writing the other addresses of the block selection addresses is performed similar to the above explanation. At this time, it is necessary to subsequently enable at the "low" level the signal $\overline{RRWj}$ (j=0~8) by fixing the address signals A0~A2 and A7~A20 and by varying the other address signals A3~A6. Thereby, when the fuse selection lines W1/→...→W8/$\overline{W8}$ are enabled in order to the "low" level, the fuses corresponding to the logic levels of the block selection addresses A12~A20 are blown. According to the above fuse blowing process, the fuses $\overline{F12}$ and F13~F20 of the fuse elements connected to the data line CN0 of FIG. 3 are blew and the other fuses F12 and $\overline{F13}$~$\overline{F20}$ are not blown.

Therefore, when nine serial fuse blowing processes are completed, the nine fuses corresponding to the fuse selection lines W0~W7 and $\overline{W8}$ of the fuses connected to the data line CN0 are blown and the address of the defective row block is written in the redundant block decoder 22, so that the address of the defective row block is written in the redundant block decoder 22.

In accordance with the above operation, after storing the address of the defective block in the normal access operation, the substitution process of the defective row block is as follows. In normal operation mode, all the fuse selection signals $\overline{RRWj}$ (j=0~8) are maintained at the "low" level and all the data line selection signals $\overline{RRbi}$ (i=0~7) are maintained at the "high" level since the redundant program control signal $\overline{RED}$ is disabled to the "high" level. Therefore, referring to FIG. 3, the outputs of the NOR gates 104 and 106 inputting the fuse selection signals $\overline{RRW0}$~$\overline{RRW8}$ are determined according to the logic levels of the corresponding block selection address signals A12~A20/$\overline{A12}$~$\overline{A20}$.

At this time, when the block selection address signals A20~A13 are input as the logic level "0" and the other block selection address signal A12 is input as the logic level "1" in the same level as the block selection address signal stored in the redundant block decoder 22, the data line CN0 in which the defective row block address is stored becomes floating. Thus, the output node of the redundant sense amplifier 102 corresponding to the floated data line CN0 is charged to the power voltage Vcc through the N-channel transistor 110, so that the redundant block selection signal RR0 is output at the "high" level.

However, the ground voltage and the current path are formed by the fuse selection lines W0~W8 or $\overline{W0}$~$\overline{W8}$ enabled to the "high" level by the address signals A12~A20 or $\overline{A12}$~$\overline{A20}$ in all the data lines CN1~CN7 in which the fuse blowing operation is not performed. Accordingly, the output node of the redundant sense amplifiers corresponding to the data lines CN1~CN7 are discharged to the ground voltage Vss. Thereby, the output node of the redundant sense amplifiers 102 corresponding to the data lines CN1~CN7 are discharged to a reference voltage Vss through the N-channel transistor 116 and all of the redundant block selection signals RR1~RR7 are thus output at the "low" level.

At this time, the row decoder operation blocking circuit 44 outputs the signal $\overline{Xd}$ at the "low" level to thereby disable the row decoder 14 depending on that the redundant block selection signal RR0 is output at the "high" level. Accordingly, the substitution of the defective row block is performed by selecting the row block within the redundant cell array 12.

Figure 7:
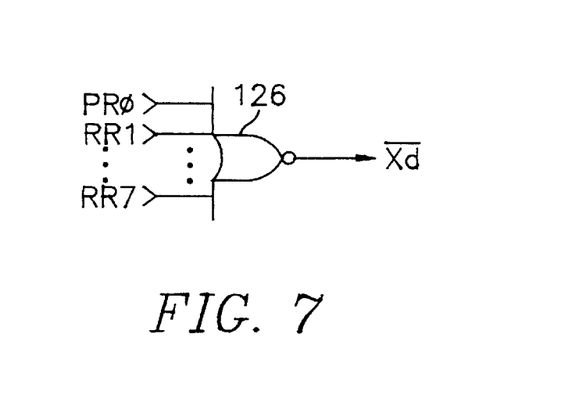
FIG. 7 is a detailed circuit diagram showing a circuit for blocking a row decoder operation.

FIG. 7 is a detailed view showing the row decoder operation blocking circuit 44 to output the control signal $\overline{Xd}$ which blocks the operation of the row decoder corresponding to the memory cell array when the defective row block is selected. In FIG. 7, the NOR gate 126 NORs the redundant block selection signals RR0~RR7 to thereby output the NORed signal as the control signal $\overline{Xd}$. Therefore, if any one of the redundant block selection signals is output at the "high" level, the control signal $\overline{Xd}$ comes to have the "low" level.

Figure 8A:
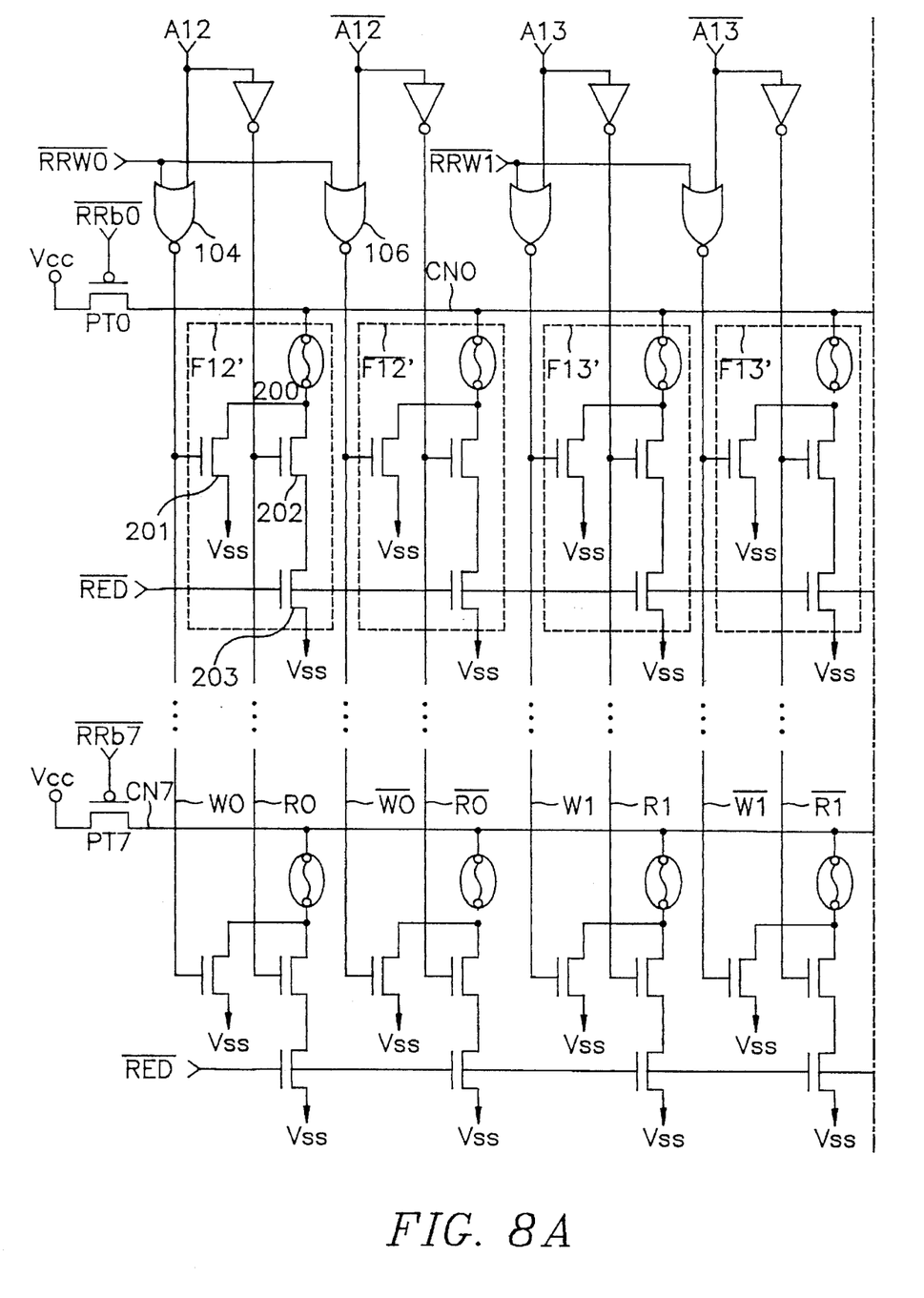
FIG. 8 is an embodiment of the redundant block decoder 22 according to the present invention, which consists of FIGS. 8A and 8B.
Figure 8B:
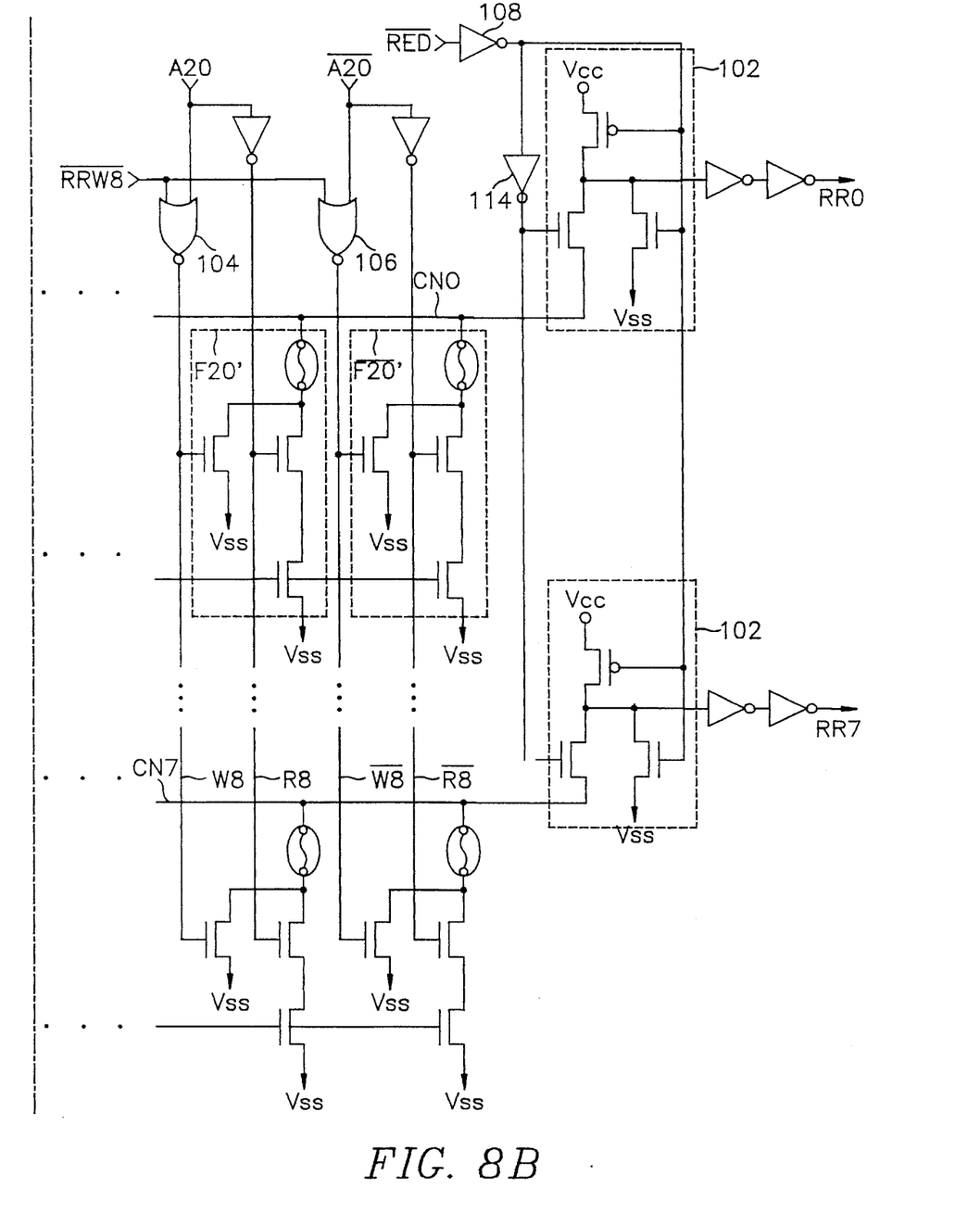

FIG. 8 is a view showing the other embodiment of the redundant block decoder 22 according to the present invention, which consists of FIGS. 8A and 8B connected to each other. Referring to FIG. 8, in the data lines CN0~CN7 arranged in the direction of row, the nine fuse elements F'12~F'20 and the nine fuse elements $\overline{F12'}$~$\overline{F20'}$ are connected to each other, the nine fuse elements F'12~F'20 being controlled by the corresponding fuse selection lines W0~W8 arranged in the direction of row and the fuse selection lines R0~R8 for read and the nine fuse elements $\overline{F12'}$~$\overline{F20'}$ being controlled by the corresponding fuse selection lines $\overline{W0}$~$\overline{W8}$ and the fuse selection lines $\overline{R0}$~$\overline{R8}$. The fuse elements comprise the fuse 200 whose one terminal is connected to the corresponding data line, an N-channel transistor 201 having the channel connected between the other terminal of the fuse 200 and the ground voltage terminal and a gate terminal connected to the corresponding fuse selection lines Wj/$\overline{Wj}$ (j=0~8), an N-channel transistor 202 having the channel whose one side is connected to the other terminal of the fuse 200 and the gate terminal connected to the fuse selection lines Rj/$\overline{Rj}$ (j=0~8), and an N-channel transistor 203 having the channel connected between the other side of the N-channel transistor 202 and the ground voltage terminal and the gate terminal connected to the redundant program control signal $\overline{RED}$.

One terminal of the data lines CN0~CN7 is supplied as the power voltage Vcc through the channels of the corresponding P-channel transistors PT1~PT7 and the other terminals thereof are each connected to the redundant sense amplifiers 102. The gate terminals of the P-channel transistors PT1~PT7 are controlled by the corresponding data line selection signals $\overline{RRb0}$~$\overline{RRb7}$. The data selection signals $\overline{RRb0}$~$\overline{RRb7}$ are the same as those of FIG. 3. As shown in <Table 1>, any one of the data line selection signals is enabled to the "low" level by the decoding of the address signals A0~A2 during the redundant program mode. Further, since the redundant sense amplifier 102 has the same function as that of FIG. 3, it will not be explained in the present invention.

The fuse selection lines W0~W8 are each connected to the corresponding output node of the eight NOR gates 104 for outputting a single NOR of the eight fuse selection signals $\overline{RRW0}$~$\overline{RRW8}$ and the block selection address signals A12~A20. The other fuse selection lines $\overline{W0}$~$\overline{W8}$ are each connected to the corresponding output node of the eight NOR gates 106 for outputting a single NOR of the eight fuse selection signals $\overline{RRW0}$~$\overline{RRW8}$ and the block selection address signals $\overline{A12}$~$\overline{A20}$. The fuse selection lines R0~R8 input the inverse level of the corresponding address signals A12~A20, whereas the other fuse selection lines $\overline{R0}$~$\overline{R8}$ also input the inverse level of the corresponding address signals $\overline{A12}$~$\overline{A20}$.

Figure 9:
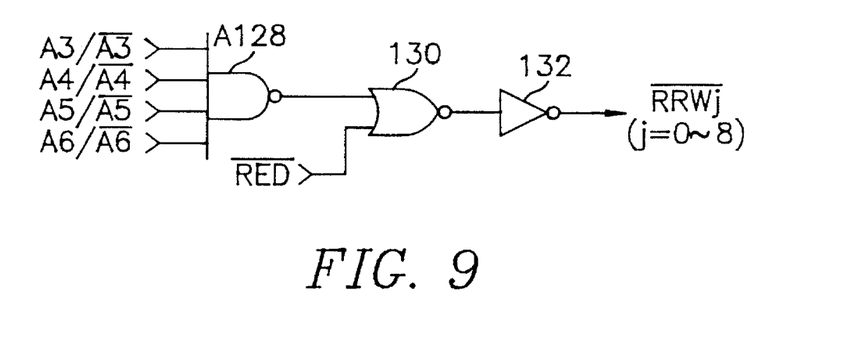
FIG. 9 is a circuit diagram showing the output of the fuse selection signals $\overline{RRW0}$~$\overline{RRW8}$ shown in FIG. 8.

FIG. 9 shows a circuit generating the fuse selection signals $\overline{RRW0}$~$\overline{RRW8}$ shown in FIG. 8. Referring to FIG. 9, a 4-input-NAND gate 128 inputs the address signals A3/$\overline{A3}$~A6/$\overline{A6}$ input from the global buffer 30 and transfers the NAND of the inputs to a NOR gate 130. The NOR gate 130 inputs an output of the NAND gate 128 and the redundant program control signal $\overline{RED}$ and transfers the NOR of the inputs to the inverter 132. Then, the output of the inverter 132 is output as the fuse selection line decoding signals $\overline{RRWj}$ (j=0~8). When the redundant program control signal $\overline{RED}$ is disenabled to the "high" level, all of the fuse selection signals $\overline{RRWj}$ (j=0~8) are output at the "high" level. However, when the redundant program control signal $\overline{RED}$ is enabled to the "low" level, i.e., the redundant program mode, as shown in <Table 2>, only the specific decoding signal is output at the "low" level according to the logic levels of the address signals. Therefore, it is possible to output any one of the fuse selection signals $\overline{RRWj}$ (j=0~8) at the "low" level by changing the logic levels of the input address signals A3/$\overline{A3}$~A6/$\overline{A6}$. Further, in the same manner as FIG. 3, it is possible to serially select and drive a pair of fuse selection lines.

In the meantime, the storage process of the defective address of FIG. 8 is as follows. When repairing the defect, the address signal and the command word are equally input to that of FIG. 3 in accordance with the first embodiment. Therefore, in the same manner as FIG. 3, an example of one case where the defective address is stored in the fuse elements connected to the data line CN0 will be provided. After the complete of the inputs of the address signals, as shown in <Table 2>, if the data line selection signal $\overline{RRbo}$ is output at the "low" level and the other signals $\overline{RRb1}$~$\overline{RRb7}$ are output at the "high" level, the data line CN0 is changed to the power voltage Vcc through the P-channel MOS transistor PT0 and the other data lines CN1~CN7 are floated. Moreover, as shown in <Table 1>, the fuse selection signal $\overline{RRW0}$ is output at the "low" level and the other signals $\overline{RRW1}$~$\overline{RRW8}$ are output at the "high" level, so that the fuse selection line W0/$\overline{W0}$ and the fuse selection line R0/$\overline{R0}$ are controlled by the logic level of the address A12 and the rest of fuse selection lines W1/$\overline{W1}$~W8/$\overline{W8}$ and the other fuse selection lines R1/$\overline{R1}$~R8/$\overline{R8}$ are floated.

Next, if the redundant program control signal $\overline{RED}$ is enabled to the "low" level according to the input of the command word, the N-channel transistors 203 of the fuse elements are turned off, so that the source terminal of the N-channel transistor 102 is floated. Therefore, the fuse selection lines R0/$\overline{R0}$~R8/$\overline{R8}$ does not influence on the program operation. Accordingly, the N-channel transistor 201 is turned on to thereby blow the fuse in accordance with the fuse selection lines W0 or $\overline{W0}$ which are output at the "high" level through the same process as the embodiment of FIG. 3.

In FIG. 8, in the normal access operation after repairing the defect, all of the fuse selection signals $\overline{RRW0}$~$\overline{RRW8}$ are output at the "high" level and all of the fuse selection lines W0/$\overline{W0}$~W8/$\overline{W8}$ are thus discharged to the ground voltage level, so that all of the N-channel transistor 201 are turned off. Therefore, there is no influence on the read operation. Further, the N-channel transistor 202 is turned on according to the selected fuse selection lines R0/$\overline{R0}$~R8/$\overline{R8}$ and the data line is thus discharged or charged depending upon whether the fuse blowing operation is performed or not.

Accordingly, in the redundant block decoder of FIG. 8, the N-channel transistor 201 is turned on according to the fuse selection lines W0/$\overline{W0}$~W8/$\overline{W8}$ selected at the "high" level during the defect repair operation, so that the fuse blowing operation is performed. In the normal access operation, the N-channel transistor 202 is turned on according to the fuse selection lines R0/$\overline{R0}$~R8/$\overline{R8}$ selected at the "high" level, so that the data lines are discharged or charged depending upon whether the fuse blowing operation is performed or not. Thus, the redundant block decoder shown in FIG. 8 stores the defective address, i.e., performs the fuse blowing operation, by performing the nine fuse blowing operations like FIG. 3. After repairing the defect, in the detection process of the defective address according to the normal block selection operation, the detection operation of whether the fuse is blew or not, is performed according to the fuse selection lines R0/$\overline{R0}$~R8/$\overline{R8}$.

As mentioned above, in the present invention, the fuse selector is included in the memory device connected to the external address pins. Further, the specific fuse is selected and blew by the fuse selector. Moreover, according to the present invention, it is possible to electrically blow the fuse in the wafer and the package states without using an added input pad by selecting and blowing the fuse due to the variation of the signals input to the external address pins.

What is claimed is:

1. A defective address storage circuit of a semiconductor memory device comprising:

a plurality of charging nodes connected in parallel, each charging node connected to a plurality of electrical fuses;

a circuit which outputs a defective address storage signal in response to an external control signal;

a current source input for supplying current to a selected one of said charging nodes in response to said defective address storage signal;

a redundant sense amplifier connected to each of said charging nodes for outputting a redundant block driving signal indicating that a defective address should be substituted when said charging node connected thereto is at a predetermined logic level during a normal access operation; and a control circuit which decodes an externally generated address signal and sequentially creates a plurality of current paths for a a plurality of selected fuses so that only one fuse is blown at a time by current provided from said selected one charging node, said control circuit being activated by said defective address storage signal.

2. A defective address storage circuit according to claim 1, wherein each of said address signals are provided through an address signal providing pin.

3. A method for storing a defective address of a semiconductor memory device having a plurality of charging nodes capable of being charged to a first voltage, each of said charging nodes coupled to a second voltage through N fuses capable of storing an N-bit-address signal designating a defective cell, said method comprising the steps of:

providing said first voltage to a selected one of said charging nodes by decoding first location information from one of said N-bit address signals generated externally; and providing said first voltage to said plurality of fuses connected to said selected charging node by decoding second position information from said one of said N-bit address signals generated externally so that said first voltage is applied to only one of said N fuses at a time by sequentially varying said second location information.

4. A defective address storage circuit according to claim 1 wherein said current source input includes a plurality of transistors, each transistor having a current path associated with one of said charging nodes, each of said transistors being controlled by charging node selection signal derived from a portion of said externally generated address signal and said defective address storage signal.

5. A defective address storage circuit according to claim 1 wherein each of said electrical fuses is made of polysilicon.

6. A defective address storage circuit according to claim 1 wherein said control circuit includes a control transistor disposed between each of said charging nodes and each of said electrical fuses, said control circuit sequentially turning on each of said transistors associated with said selected charging node so that said first voltage is applied to only one of said N fuses at a time.

7. A method according to claim 3 wherein said step of providing said first voltage to a selected one of said charging nodes applies a charging node selection signal to a selected current source input transistor, said charging node selection signal obtained from said first location information.

8. A method according to claim 3 wherein said step of providing said first voltage controls application of said first voltage using a control transistor disposed between each of said charging nodes and each of said electrical fuses so that only one of said control transistors is selected at a time, each of said control transistors being controlled by a control signal derived from said second position information.

* * * * *